United States Patent [19]

Gent

[11] Patent Number: 4,473,780
[45] Date of Patent: Sep. 25, 1984

[54] AMPLIFIER CIRCUIT AND FOCUS VOLTAGE SUPPLY CIRCUIT INCORPORATING SUCH AN AMPLIFIER CIRCUIT

[75] Inventor: Derek J. Gent, Sutton, England

[73] Assignee: U.S. Philips Corporation, New York, N.Y.

[21] Appl. No.: 329,376

[22] Filed: Dec. 10, 1981

[30] Foreign Application Priority Data

Dec. 19, 1980 [GB] United Kingdom ............... 8040799

[51] Int. Cl.³ .......................................... H01J 29/58
[52] U.S. Cl. ................................... 315/382; 330/311
[58] Field of Search ............... 315/382, 31 R, 31 TV; 330/311

[56] References Cited

U.S. PATENT DOCUMENTS 4,250,463 2/1981 Foster ............................... 330/311
4,270,126 5/1981 Bafaro ............................... 315/383
4,361,785 11/1982 Stapleton ........................... 315/382

FOREIGN PATENT DOCUMENTS 54-152845 5/1978 Japan ................................. 330/311

Primary Examiner—Theodore M. Blum
Attorney, Agent, or Firm—Thomas A. Briody; William J. Streeter; Edward W. Goodman

[57] ABSTRACT

In an amplifier circuit a first and a second transistor and a load resistor are connected between supply terminals. An input terminal receives an input signal, comprising two signal components having, respectively relatively high and low frequencies, for applying said input signal to the second transistor. The base of the first transistor is decoupled by a capacitor at the high frequency only which results in the first transistor amplifying the high frequency component while the second transistor amplifies the low frequency component.

7 Claims, 4 Drawing Figures frequencies while providing a blocking function at the lower frequency. Thus the base of transistor T1 in the presence of the above signal components is at a d.c. bias potential at the higher frequency due to the presence of capacitor C1 which bias varies at the lower frequency rate due to the base current for transistor F1 flowing through the bias resistor R2.

The two signals are applied to the base of transistor T2 and, in view of the low impedance to ground present at the emitter of transistor T1 by virtue of capacitor C1 connected to the base of that transistor, the transistor T2 will not amplify the high frequency component present at terminal 3, transistor T2 effectively operating in the grounded collector state for the high frequency component, for the low frequency component transistor T2 effectively operates as a grounded emitter amplifier and thus this transistor amplifies the low frequency component such that this amplified component appears at the collector of this transistor. For the low frequency component, transistor T1 is effectively bottomed by the low frequency base current flowing in that transistor and thus transistor T1 and resistor R1 provide the low frequency component load for transistor T2. Transistor T1, for the high frequency component, operates effectively as a grounded base amplifier whose load is the resistor R1 and thus the high frequency component is amplified by transistor T1. The high frequency and low frequency currents through resistor R1 produce an amplified signal containing these two components at an output terminal 4 connected to this resistor R1 as shown. As it is unlikely that the gains of transistors T1 and T2 would be matched to each other, a feedback network comprising two resistors R3 and R4 is connected between the collector of transistor T1 and ground with the junction of these two resistors R3 and R4 being connected to the base of transistor T2 and which also provides the d.c. bias for that base, while ensuring the T1 is bottomed at low frequencies.

Although the circuit of FIG. 1 has been described with only two components in the signal applied to the base of transistor T2, the signal could contain a plurality of components whose frequencies lie between the low and the high frequency. While the lower frequency components will be amplified by transistor T2 and the higher frequency components by transistor T1, there will be a range of frequencies over which amplification will take place by both transistors.

One particular use of the basic circuit shown in FIG. 1 is to provide amplification of two components, one being at field frequency and the other being at line frequency in a picture display apparatus to provide a dynamic focus voltage to the focus electrode of a cathode ray tube in such a display apparatus. In such apparatus where very high resolution is required as with alphanumeric display on a monochrome cathode ray display tube, it is required to provide a focus voltage for the focus electrode which varies parabolically at both the line and field rates. Such a circuit is shown in FIG. 2 and like components between this circuit and that shown in FIG. 1 are given like references. In FIG. 2 a parabolic voltage at a line frequency of 64 kHz is applied to a terminal 3A, this voltage being applied to the base of transistor T2 through a resistor R5. A terminal 3B receives a parabolic voltage at a field frequency of 60 Hz which is applied through a resistor R6 to the base of transistor T2. The d.c. bias for transistor T1 is provided by a potential divider comprising resistor R2 and a further resistor R7 connected between the base of transistor T1 and ground. Feedback for the amplifier circuit is provided in the same way as in FIG. 1.

FIG. 3 shows some of the waveforms of the voltages present at various points in FIG. 2. FIG. 3a shows the parabolic voltage at line frequency present at terminal 3A, while FIG. 3b shows the parabolic voltage at line frequency present at terminal 3B, these two waveforms not being to the same time scale. In the same way as with FIG. 1, transistor T2 only amplifies the component at field frequency and FIG. 3c, which is to the same time scale as FIG. 3b, shows this amplified field frequency component as present at the collector of transistor T2. It will be seen that only a small amount of the line frequency component is present on this field frequency voltage as transistor T2 does not substantially amplify this component. FIG. 3d, also to the same time scale as FIG. 3b, shows the combination of the amplified line and field frequency components present at the collector of transistor T1. This amplified signal is applied as shown in FIG. 2, through a capacitor C2 and a resistor R8 to the g3 focus electrode of a cathode ray display tube DT. This field and line rate varying voltage is added to a d.c. voltage derived from a potential divider comprising a resistor R9 and a potentiometer R10 connected between supply terminal 1 and a terminal 5 which may convey a negative voltage depending on the type of display tube with which the circuit is to be used. The wiper of potentiometer R10 is connected through a resistor R11 to the junction of capacitor C2 and resistor R8 to provide the required d.c. focus voltage. If the levels of either of the inputs at terminals 3A or 3B are to be varied then a diode D connected to the conductivity direction shown should be provided across resistor R11 to clamp the lower edge of the dynamic focus voltage.

In a practical embodiment of FIG. 2 the following component and supply values were employed:

| | | | |
|---|---|---|---|
| C1 | 470pF | R5 | 10 k Ω |
| C2 | 68nF | R6 | 10 k Ω |
| | | R7 | 560 k Ω |
| R1 | 330 k Ω | R8 | 220 k Ω |
| R2 | 1M Ω | R9 | 820 k Ω |
| R3 | 680k Ω | R10 | 2.2M Ω linear |
| R4 | 3.3k Ω | R11 | 2.2M Ω |
| D | Philips type BYV 95E | | |
| DT | Philips type M38 range | | |
| T1 | } Philips type BF 459 or BF 859 | | |
| T2 | | | |

Supply at terminal 1: +740 V
Supply at terminal 5: −140 V
Line frequency parabola input at terminal 3A: 6 V peak-peak
Field frequency parabola input at terminal 3B: 6 V peak-peak
Field frequency parabola at T2 collector: 250 V peak-peak
Output at T1 collector: 250 V peak-peak field frequency parabolic component and 250 V peak-peak line frequency parabolic component.

A modification of part of the circuit shown in FIG. 1 or FIG. 2, is shown in FIG. 4 where a further transistor T3 of the same conductivity type as T1 and T2 has its collector connected to the emitter of transistor T2 while its emitter is connected through a resistor R12 to ground, resistor R12 being decoupled by a capacitor C3 placed in parallel with it. The base of transistor T3 is

AMPLIFIER CIRCUIT AND FOCUS VOLTAGE SUPPLY CIRCUIT INCORPORATING SUCH AN AMPLIFIER CIRCUIT

BACKGROUND OF THE INVENTION

The invention relates to an amplifier circuit comprising first and second transistors of like conductivity type with the emitter of the first transistor connected to the collector of the second transistor, the transistors being arranged with their main current paths in series in a voltage sharing configuration between first and second supply terminals for a voltage supply, means for d.c. biasing the base of said first transistor for setting the quiescent voltage at the connection between the first and second transistors, means for applying an input signal comprising relatively high and low frequency components to the second transistors and means for deriving an output signal from a load connected between the collector of the first transistor and the first supply terminal.

Amplifier circuits of the above type usually obtain the d.c. bias for the base of the first transistor from the collector of that transistor which means that an a.c. component is applied to that base. This results in both transistors amplifying both the high and low frequency components. Alternately, the base of the first transistor may be separately d.c. biased with this base being decoupled for all amplifier signal frequencies which would produce the same result.

SUMMARY OF THE INVENTION

It is an object of the present invention to provide an amplifier circuit of the type described in which the amplification function may be divided. By splitting the amplifying action over two transistors separate control can be obtained for the high and low frequency components.

The amplifier circuit according to the invention is characterized in that the base of the first transistor is decoupled at said high frequency but not at said low frequency and in that, in operation the first transistor amplifies the high frequency component but substantially not the low frequency component while the second transistor amplifies the low frequency component but substantially not the high frequency component. Such a circuit has the advantage that only one frequency component is amplified by each transistor.

The circuit may be further characterized in that the input signal is applied to the base of the second transistor, the emitter of said second transistor being connected to the second supply terminal. An alternative circuit may be characterized in that the collector of the second transistor is connected to the emitter of a third transistor of like conductivity type whose main current path is in series with that of the first and second transistors, the emitter of the second transistor being coupled to the second supply terminal and the input signal being applied to the base of said second transistor, and in that means are provided for biasing the third transistor such that the quiescent voltage at the connection between said second and third transistor is closer to the potential of the second supply terminal than the voltage at the connection between the first and third transistors. Here the second transistor is current driven by the third transistor.

The invention also relates to a dynamic focus voltage supply circuit for display apparatus having a cathode ray tube, said supply circuit incorporating an amplifier circuit as described above, said dynamic focus voltage supply circuit being characterized in that the input signal applied to said second transistor comprises a parabolic component at field frequency and a parabolic component at line frequency, the output signal containing a parabolic component at line frequency and a parabolic component at field frequency, means being provided for applying the output signal to the focus electrode of said cathode ray tube.

It will be appreciated that the invention thus provides a convenient way of achieving dynamic focus control which does not use transformers.

DESCRIPTION OF THE DRAWINGS

The above and other features of the invention will be more readily understood by a perusal of the following description with reference to the accompanying drawings, of which.

DESCRIPTION OF THE PREFERRED EMBODIMENTS

Figure 1:
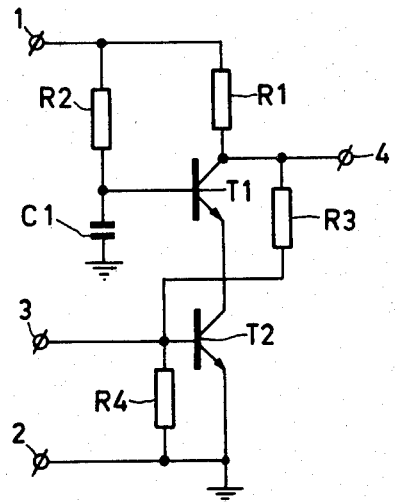
FIG. 1 is a circuit diagram of an amplifier circuit according to the invention.
Figure 4:
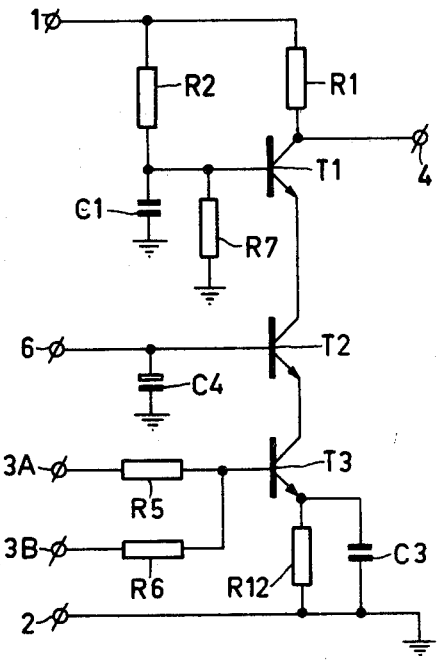
FIG. 4 is a circuit diagram shown in modification of part of FIG. 2.
Figure 2:
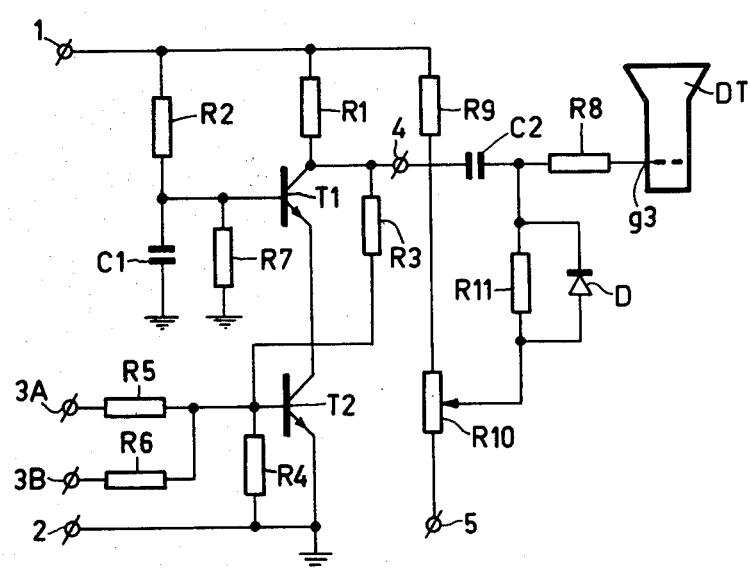
FIG. 2 is a circuit diagram of a dynamic focus voltage supply circuit incorporating an amplifier according to the invention.
Figure 3:
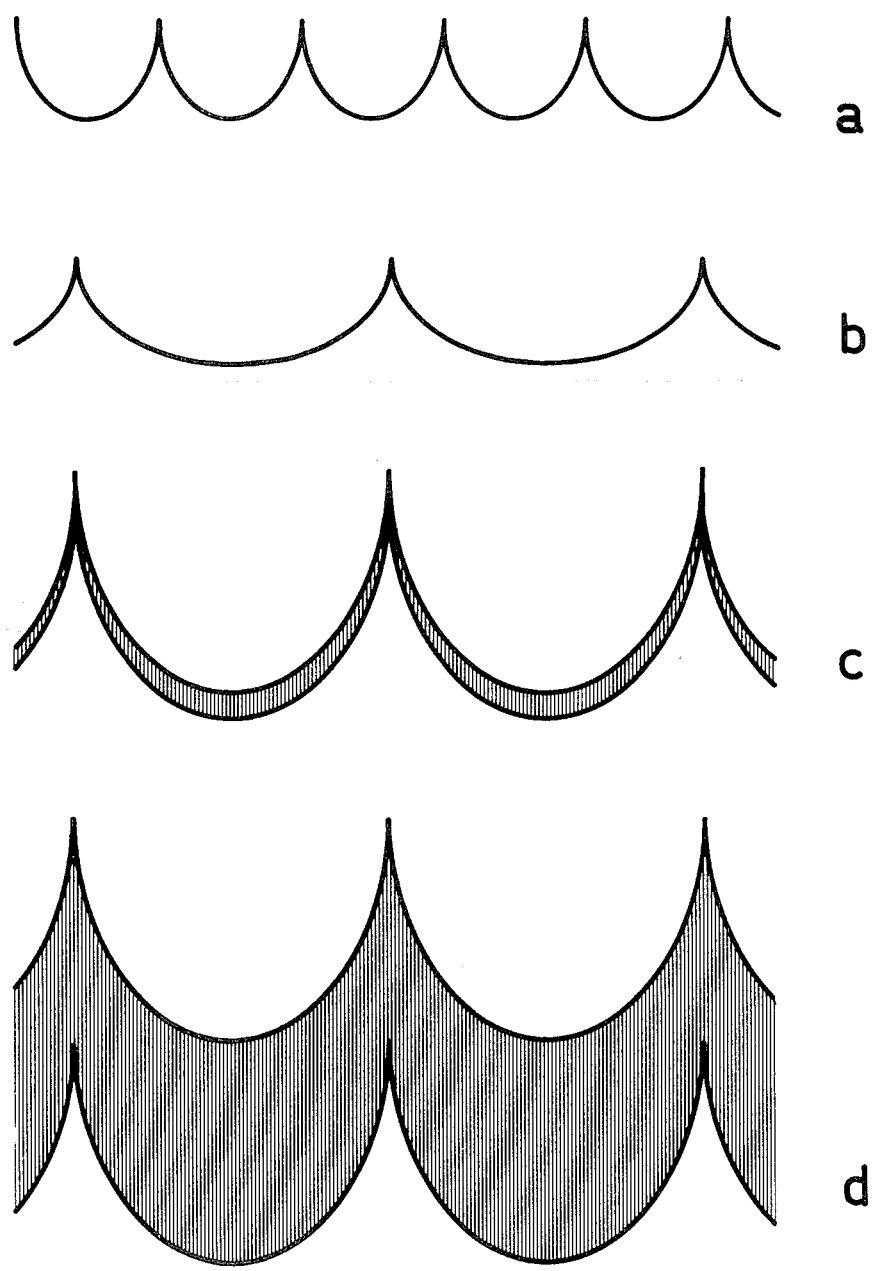
FIG. 3 shows waveforms appearing at certain points in FIG. 2.

In FIG. 1 terminal 1 is connected to the positive terminal of a high voltage power supply which typically may be 600 volts d.c. or in excess of that voltage. The terminal 1 is connected through a load resistor R1 to the collector of a transistor T1 whose emitter is directly connected to the collector of a second transistor T2, the emitter of transistor T2 being connected at a terminal 2 to ground to which the other terminal of the power supply is also connected. Transistors T1 and T2 are of like conductivity type, in this case npn, and are both of a type which will not satisfactorily operate across the full voltage of the supply at terminal 1, the transistors typically being high voltage devices having a high gain at high frequencies. The base of transistor T1 is connected through a bias resistor R2 to terminal 1 to produce at the base a d.c. bias voltage, in the absence of signals in the circuit, which sets the quiescent voltage at the emitter of transistor T1, this voltage being Vbe less than the voltage at this transistors base, Vbe being understood to be the threshold voltage at the base-emitter junction. Under normal circumstances where transistors T1 and T2 are of the same type the maximum quiescent voltage at the connection between these transistors will normally be half the supply voltage present at terminal 1. A capacitor C1 is connected between the base of transistor T1 and ground, the purpose of this capacitor being explained hereinafter. The base of transistor T2 is connected to a terminal 3 to which the input signal for the amplifier circuit is applied. Such an input signal will contain components at relatively high and low frequencies and in one such instance, the input signal may contain two components of which one may be a low frequency component of 60 Hz and the other a high frequency component of 64 kHz. With the above frequencies in mind, capacitor C1 is arranged to provide a low impedance to ground at the higher of these two arranged to receive the relatively high and low frequency components. The base of transistor T2 is connected to a terminal 6 which receives a d.c. bias for setting the quiescent voltage in the absence of signals in the circuit at the collector of transistor T3, which may be of a type for operating at a very much lower voltage (typically 12 V) than transistors T1 and T2. The base of transistor T2 is decoupled for all signal frequencies by a capacitor C4 having a large value and said base is d.c. biased in such a way that the quiescent voltage at the collector of transistor T3 is much lower than that at the collector of transistor T2. In the arrangement shown in FIG. 4, the transistor T3 provides current drive to transistor T2 at all signal frequencies for transistors T1 and T2 which operate in a manner similar to that described above.

While in the above description reference is made to only two transistors amplifying two signal components, arrangements are envisaged where a number of transistors are serially connected as in the manner for transistors T1 and T2 and where the bases of the other transistors are decoupled at various frequencies such that each transistor only amplifies part of the range of frequencies. With such an arrangement it would also be possible to derive components at different frequencies from the various transistors in the arrangement.

What is claimed is:

1. A dynamic focus voltage supply circuit for display apparatus having a cathode ray tube, said supply circuit having an amplifier circuit comprising first and second transistors of like conductivity type with the emitter of the first transistor being coupled to the collector of the second transistor, the transistors being arranged with their main current paths in series in a voltage sharing configuration between first and second supply terminals for a voltage supply, means for biasing the base of said first transistor for setting the quiescent voltage at the connection between the first and second transistors, means for applying an input signal having relatively high and low frequency components to the second transistor, said components comprising a parabolic component at line frequency and a parabolic component at field frequency, respectively, means for deriving an output signal having a parabolic component at line frequency and a parabolic component at field frequency, from a load connected between the collector of the first transistor and the first supply terminal, and means for applying the output signal to a focus electrode of said cathode ray tube, characterized in that said means for biasing the base of said first transistor includes a capacitor having a low capacitance, said biasing means thereby presenting to said first transistor base a bias potential unaffected by said high frequency component which bias varies at said low frequency component rate, whereby the first transistor amplifies the high frequency component but substantially not the low frequency component while the second transistor amplifies the low frequency component but substantially not the high frequency component.

2. A dynamic focus voltage supply circuit as claimed in claim 1, characterized in that the input signal is applied to the base of the second transistor, the emitter of said second transistor being connected to the second supply terminal.

3. A dynamic focus voltage supply circuit as claimed in claim 1, characterized in that the amplifier circuit further comprises a third transistor of like conductivity type arranged between said first and second transistors, the main current path thereof being in series with that of the first and second transistors, the collector of said second transistor being connected to the emitter of said third transistor, the emitter of the second transistor being coupled to the second supply terminal and the input signal being applied to the base of said second transistor, and means for biasing the third transistor such that the quiescent voltage at the connection between said second and third transistor is closer to the potential of the second supply terminal than the voltage at the connection between the first and third transistor.

4. A dynamic focus voltage supply circuit as claimed in claim 1 or 2, characterized in that the voltage at the connection between said first and second transistors is substantially half that of the supply when applied to said supply terminals.

5. A dynamic focus voltage supply circuit as claimed in claim 3, characterized in that the voltage at the connection between said first and third transistors is substantially half that of the supply when applied to said supply terminals.

6. A dynamic focus voltage supply circuit as claimed in claim 1, 2, 3 or 5, characterized in that the output signal is a.c. coupled to the focus electrode, to which electrode a d.c. voltage is additionally applied.

7. A dynamic focus voltage supply circuit as claimed in claim 4, characterized in that the output signal is a.c. coupled to the focus electrode, to which electrode a d.c. voltage is additionally applied.

* * * * *